(12) United States Patent
Noda et al.

(10) Patent No.: US 7,397,414 B2
(45) Date of Patent: Jul. 8, 2008

(54) ELECTROMAGNETIC WAVE ABSORPTION COMPLEX, AND METHOD OF PRODUCING THE SAME

(75) Inventors: Kenichi Noda, Nagoya (JP); Yasumasa Kato, Nagoya (JP); Haruo Kitamura, Settsu (JP); Masao Ogawa, Settsu (JP)

(73) Assignee: Miyagawa Kasei Industry Co., Ltd., Osaka (JP)

( * ) Notice: Subject to any disclaimer, the term of this patent is extended or adjusted under 35 U.S.C. 154(b) by 0 days.

(21) Appl. No.: 10/550,544

(22) PCT Filed: Apr. 15, 2004

(86) PCT No.: PCT/JP2004/005432

§ 371 (c)(1),
(2), (4) Date: Sep. 26, 2005

(87) PCT Pub. No.: WO2004/093512

PCT Pub. Date: Oct. 28, 2004

(65) Prior Publication Data

US 2006/0202882 A1 Sep. 14, 2006

(30) Foreign Application Priority Data

Apr. 17, 2003 (JP) ............................. 2003-112784
Dec. 18, 2003 (JP) ............................. 2003-421156

(51) Int. Cl.
*H01Q 17/00* (2006.01)
*G21K 1/10* (2006.01)
*H05K 9/00* (2006.01)

(52) U.S. Cl. .................... 342/4; 342/1; 523/1; 523/137

(58) Field of Classification Search ................. 342/1–4; 174/32, 350, 388–397; 252/62.51 R–62.51 C; 523/1, 137
See application file for complete search history.

(56) References Cited

U.S. PATENT DOCUMENTS 3,315,259 A * 4/1967 Wesch ........................... 342/3

(Continued)

FOREIGN PATENT DOCUMENTS

JP 62-4199 U 1/1987

(Continued)

OTHER PUBLICATIONS

C.M. Cotell et al, "Low Dielectric Constant Polymers," no date given; Naval Research Laboratory; Washington, D.C.*

(Continued)

*Primary Examiner*—Bernarr E Gregory
(74) *Attorney, Agent, or Firm*—Birch, Stewart, Kolasch & Birch, LLP

(57) ABSTRACT

An electromagnetic wave absorber is formed by injection-molding a thermoplastic resin blended with approximately 20-60% by volume of soft magnetic material powder, and blended with a molding assistant and a kneading assistant. The electromagnetic wave absorber includes a unit cell having a bore extending from a top face to a bottom face. A portion of the bore located more adjacently to the bottom face than to the top face has a smaller cross-sectional area than the bore at the top face, and a height of the unit cell from the bottom face to the top face is approximately at least 1.2 times and approximately at most 10 times as large as the maximum width of the bore at the top face of the unit cell.

6 Claims, 14 Drawing Sheets

U.S. PATENT DOCUMENTS

| | | | | |
|---|---|---|---|---|
| 3,441,933 | A * | 4/1969 | Tuinila et al. | 342/4 |
| 4,003,840 | A * | 1/1977 | Ishino et al. | 342/1 |
| 4,050,073 | A * | 9/1977 | Wesch | 342/4 |
| 4,118,704 | A * | 10/1978 | Ishino et al. | 342/4 |
| 5,771,013 | A * | 6/1998 | Fey | 342/4 |
| 6,217,978 | B1 * | 4/2001 | Murase et al. | 342/1 |
| 6,373,425 | B1 * | 4/2002 | Inoue et al. | 342/1 |

FOREIGN PATENT DOCUMENTS

| | | |
|---|---|---|
| JP | 62-134297 U | 8/1987 |
| JP | 10-107541 A | 4/1998 |
| JP | 10-313192 A | 11/1998 |
| JP | 2000-277972 A | 10/2000 |
| JP | 2000-353610 A | 12/2000 |
| JP | 2001-237591 A | 8/2001 |

OTHER PUBLICATIONS

Entry for "Kolon Kopa (R) N-66 KN333MT30 N-66 Nylon 66 Resin" in the MatWeb on-line materials database; no author given; no date given; copyright 1996-2006; posted on line at matweb.com.*

* cited by examiner

ELECTROMAGNETIC WAVE ABSORPTION COMPLEX, AND METHOD OF PRODUCING THE SAME

TECHNICAL FIELD

The present invention relates to a composite body for absorbing an electromagnetic wave, which serves to absorb a radio noise coming externally to prevent its effect, and a method of manufacturing the same.

BACKGROUND OF THE INVENTION

As the number of electronic devices has recently been increased, the individual devices are mutually interfered with electromagnetic waves emitted from the devices, which increasing the risk of their malfunction. In addition, an electronic device may also malfunction due to an electromagnetic wave emitted from the device itself The effect of the electromagnetic wave emitted from the electronic device on a living body is also a matter of concern.

Therefore, an electromagnetic wave absorber for absorbing a harmful electromagnetic wave with high efficiency has increasingly been developed in recent years, and various shapes of the electromagnetic wave absorber and methods of manufacturing the same have been proposed.

For example, Japanese Patent Laying-Open No. 2000-353610 discloses a method of manufacturing an electromagnetic wave absorber including the steps of blending and kneading a finely-ground soft magnetic material and a thermoplastic binder to produce pellets of a given particle size, which are then heated and pressurized to be injected into a pair of molds having a space corresponding to an electromagnetic wave absorber to be manufactured to provide a compact, baking the compact at approximately 300-600° C. to thermally decompose the contained thermoplastic binder and degreasing the compact, and baking the degreased compact at approximately 1000-1350° C. to sinter the soft magnetic material and provide a sintered compact, in order that a thin-walled, three-dimensional electromagnetic wave absorber having a fairly constant permeability can be manufactured at low costs.

The electromagnetic wave absorbing performance of the electromagnetic wave absorber is mainly determined by its shape and material. Therefore, in the case of the three-dimensional shape as in the electromagnetic wave absorber described in Japanese Patent Laying-Open No. 2000-353610, an electromagnetic wave absorber having a larger height is thought to exhibit higher electromagnetic wave absorbing performance. However, it is difficult to manufacture an electromagnetic wave absorber having a larger height.

The document above does not describe how high an electromagnetic wave absorber is to be made so that the absorber can be manufactured with high yields while its electromagnetic wave absorbing performance is kept high. Therefore, it is difficult to obtain, with high yields, an electromagnetic wave absorber excellent in electromagnetic wave absorbing performance. Furthermore, the method described in the document above tends to cause quenching cracks after sintering, which contributes to the reduction in yield.

For an electromagnetic wave absorber used for an anechoic chamber and others, one made of urethane sponge impregnated with carbon is generally used. However, such an absorber has low strength and is highly flammable, resulting in poor durability. If such an absorber is used for a floor material, it is necessary to reinforce the absorber with another member. Disadvantageously, such an absorber also has a water-absorbing property, which lowers its electromagnetic wave absorbing performance, and has low weather resistance, which makes the same unusable outdoors and under the circumstances of high temperature and high humidity.

BRIEF SUMMARY OF THE INVENTION

The present invention is made to solve the problems above. An object of the present invention is to provide a composite body for absorbing an electromagnetic wave of high strength, high heat resistance and high incombustibility, usable even outdoors and under the circumstances of high temperature and high humidity, and with electromagnetic wave absorbing performance excellent in high yield and productivity.

A composite body for absorbing an electromagnetic wave according to the present invention is, in one aspect, formed by injection-molding a thermoplastic resin blended with approximately 20-60% by volume of soft magnetic material powder (preferably, also blended with a molding assistant and a kneading assistant), and includes a unit cell having a bore extending from a top face to a bottom face. A portion of the bore located more adjacently to the bottom face than to the top face has a smaller cross-sectional area than the bore located at the top face, and a height of the unit cell from the bottom face to the top face is approximately at least 1.2 times and approximately at most 10 times, and preferably approximately at least 2 times and approximately at most 6 times, as large as the maximum width of the bore at the top face of the unit cell. In the present specification, the "unit cell" means a unit structure forming at least a part of the composite body for absorbing an electromagnetic wave and is defined as a wall structure having a single bore therein. The soft magnetic material powder is a material whose magnetization is more likely to be oriented in the direction of a magnetic field applied externally, namely, an easily-magnetized material. Examples of the soft magnetic material powder include an iron-nickel alloy (Permalloy (R)), an iron-cobalt alloy (permendur), an iron-chrome alloy (magnetic stainless steel), an iron-silicon alloy, an iron-aluminum-silicon alloy (sendust), a cobalt-tungsten-chrome-carbon alloy (Stellite (R)), a nickel-chrome-boron-iron-silicon alloy (Colmonoy (R)), iron-nickel-cobalt alloy (perminvar) powder, iron-aluminum alloy (alperm) powder, and others. The cross-sectional area of the bore is an area of the bore cut in a direction orthogonal to the direction of the height of the composite body for absorbing an electromagnetic wave from the bottom face to the top face.

A wall of the unit cell defining the bore above is typically formed of an inclined plane. Alternatively, the wall may be formed of a plane other than the inclined plane, and the inclined plane may not extend continuously. A cross-sectional area of the bore at the top face is preferably larger than that of a portion of the bore obtained by cutting the unit cell, which is located more adjacently to the bottom face than to the top face, in a direction orthogonal to the direction along which the bore extends. However, the bore is only required to have a portion whose part located more adjacently to the bottom face than the top face of the composite body for absorbing an electromagnetic wave has a smaller cross-sectional area than the bore located at the top face.

As described above, by setting the height of the unit cell from the bottom face to the top face to be approximately at least 1.2 times and approximately at most 10 times as large as the maximum width of the bore located at the top face of the unit cell, the composite body for absorbing an electromagnetic wave can attain improved electromagnetic wave absorbing performance and can be manufactured with high yields. Furthermore, by injection-molding the thermoplastic resin blended with the molding assistant and the kneading assistant, and further blended with approximately 20-60% by volume of the soft magnetic material powder, the steps of degreasing and sintering can be omitted, which makes it possible to mold a composite body for absorbing an electromagnetic wave with high yields and high precision even if the composite body has a relatively complex shape.

Here, the reason why the height of the unit cell from the bottom face to the top face is set to be approximately at least 1.2 times and approximately at most 10 times as large as the maximum width is as follows. If the height is approximately less than 1.2 times as large as the maximum width, much improvement in electromagnetic wave absorbing performance cannot be obtained. If the height is approximately more than 10 times as large as the maximum width, it becomes difficult to manufacture the composite body and it is impossible to expect further improvement in electromagnetic wave absorbing performance. The reason why the thermoplastic resin is blended with approximately 20-60% by volume of the soft magnetic material powder is as follows. If approximately less than 20% by volume of soft magnetic material powder is used, magnetic loss is reduced and electromagnetic wave absorbing performance is lowered. If approximately more than 60% by volume of the soft magnetic material powder is used, it becomes difficult to uniformly blend the soft magnetic material powder into the thermoplastic resin.

A concave portion is preferably provided around the bore to extend from the bottom face of the unit cell to the top face of the unit cell. Moreover, the concave portion preferably surrounds the bore, and forms a cylindrical portion surrounding the bore on a side of the bottom face of the unit cell. Furthermore, it is preferable to provide a rib connecting the cylindrical portions.

The thermoplastic resin may contain an olefin resin, and may contain a polyamide resin. The "olefin resin" here is a resin such as polyethylene, polypropylene, methylpentene polymer, polybutene-1, or cycloolefin polymer. The "polyamide resin" is a resin such as polyamide 6, polyamide 6-6, polyamide 4-6, polyamide 11, or polyamide 12.

Preferably, the soft magnetic material powder has a scale-like shape, and has a ratio of the maximum length and a thickness of approximately 3-20. This is because if the aspect ratio of each of the particles (the ratio of the maximum length and the thickness) is approximately less than 3, permeability is lowered, which results in lower electromagnetic wave absorbing performance. If the aspect ratio exceeds approximately 20, it becomes difficult to manufacture the soft magnetic material powder.

Furthermore, the soft magnetic material powder preferably has a mean particle diameter converted to spherical diameter of approximately 5-50 µm. This is because if the mean particle diameter converted to spherical diameter is approximately less than 5 µm, it becomes difficult to manufacture the soft magnetic material powder, which results in cost increase. If the mean particle diameter converted to spherical diameter exceeds approximately 50 µm, the ratio of the soft magnetic material powder blended into the thermoplastic resin is lowered, which results in lower electromagnetic wave absorbing performance.

The composite body for absorbing an electromagnetic wave according to the present invention is, in another aspect, formed by injection-molding a thermoplastic resin blended with approximately 20-60% by volume of soft magnetic material powder, and includes a bore extending from a top face to a bottom face. A portion of the bore located more adjacently to the bottom face than to the top face has a smaller cross-sectional area than the bore at the top face, and concave and convex portions are provided at the top face.

The inventors of the present invention have tested various shapes of composite bodies for absorbing an electromagnetic wave on their electromagnetic wave absorbing performance and found that it is possible to improve electromagnetic wave absorbing performance by providing concave and convex portions at the top face of the composite body for absorbing an electromagnetic wave, which has a bore of the shape above.

The composite body for absorbing an electromagnetic wave according to the present invention preferably has a wall portion surrounding the bore. A convex portion is provided at a top face of an intersection of the wall portions, and a concave portion is provided at a top face of the wall portion located between the intersections. More preferably, the concave portion and the convex portion are provided at the top face of the wall portion such that the top face of the wall portion has a V-shape, and that a longitudinally central portion of the top face of the wall is the most concave. More preferably, a pair of inclined planes are combined to form the top face of the wall portion, and the pair of the inclined planes are combined into a mountain-like shape such that a central portion of the wall portion in a direction of the thickness thereof protrudes most upwardly at the top face, and that a ridge of the mountain-like shape, which is made of the pair of inclined planes at the top face of the wall portion, extends in a longitudinal direction of the top face of the wall portion to take a V-shape.

A method of manufacturing a composite body for absorbing an electromagnetic wave according to the present invention includes the steps of kneading a thermoplastic resin blended with approximately 20-60% by volume of soft magnetic material powder (preferably, also blended with a molding assistant and a kneading assistant) to provide a kneaded material, injection-molding the kneaded material into a desired shape to provide a compact, and cooling the injection-molded compact for solidification.

As such, the steps of degreasing and sintering are not performed after the step of injection molding, which causes no quenching crack and can improve yields. In addition, the process can also be simplified.

According to the present invention, after the thermoplastic resin blended with a specific material is injection-molded, a composite body for absorbing an electromagnetic wave can be formed without the steps of degreasing and sintering. Therefore, it is possible to obtain, with high yields, a composite body for absorbing an electromagnetic wave having a complex shape, having high strength and high heat resistance, and usable even outdoors and even under the circumstances of high temperature and high humidity. Moreover, since the height of the unit cell from the bottom face to the top face is set to be at least 1.2 times and at most 10 times as large as the maximum width of the bottom face of the unit cell, it is even possible to assure excellent electromagnetic wave absorbing performance. Additionally, it is also possible to obtain excellent electromagnetic wave absorbing performance by providing concave and convex portions at the top face of the composite body for absorbing an electromagnetic wave. Therefore, it is possible to obtain, with high yields, a composite body for absorbing an electromagnetic wave excellent in electromagnetic wave absorbing performance, heat resistance, and weather resistance.

DETAILED DESCRIPTION OF THE INVENTION

Embodiments of the present invention will now be described in reference to FIGS. 1-18.

An composite body for absorbing an electromagnetic wave according to the present embodiment is formed by injection-molding a thermoplastic resin blended with approximately 20-60% by volume (preferably approximately 30-58% by volume) of soft magnetic material powder (more preferably, also blended with a molding assistant and a kneading assistant). Accordingly, it is possible to mold a composite body for absorbing an electromagnetic wave with high yields and high precision even if the composite body has an extremely complex shape. Furthermore, it is possible to obtain a composite body for absorbing an electromagnetic wave of high strength, high heat resistance and high incombustibility, and usable even outdoors and even under the circumstances of high temperature and high humidity.

Examples of the thermoplastic resin include a resin containing an olefin resin such as polyethylene, polypropylene, methylpentene polymer, polybutene-1, or cycloolefin polymer, and a resin containing a polyamide resin such as polyamide 6, polyamide 6-6, polyamide 4-6, polyamide 11, or polyamide 12.

Examples of the soft magnetic material powder include Permalloy (R) powder and others. The soft magnetic material powder preferably has a scale-like shape and has an aspect ratio of approximately 3-20. More preferably, the soft magnetic material powder has an aspect ratio of approximately 10-15. The soft magnetic material powder preferably has a mean particle diameter converted to spherical diameter of approximately 5-50 μm, more preferably of approximately 10-25 μm.

Examples of the shape of a composite body for absorbing an electromagnetic wave according to the present embodiments will now be described in reference to FIGS. 1-18.

Figure 1:
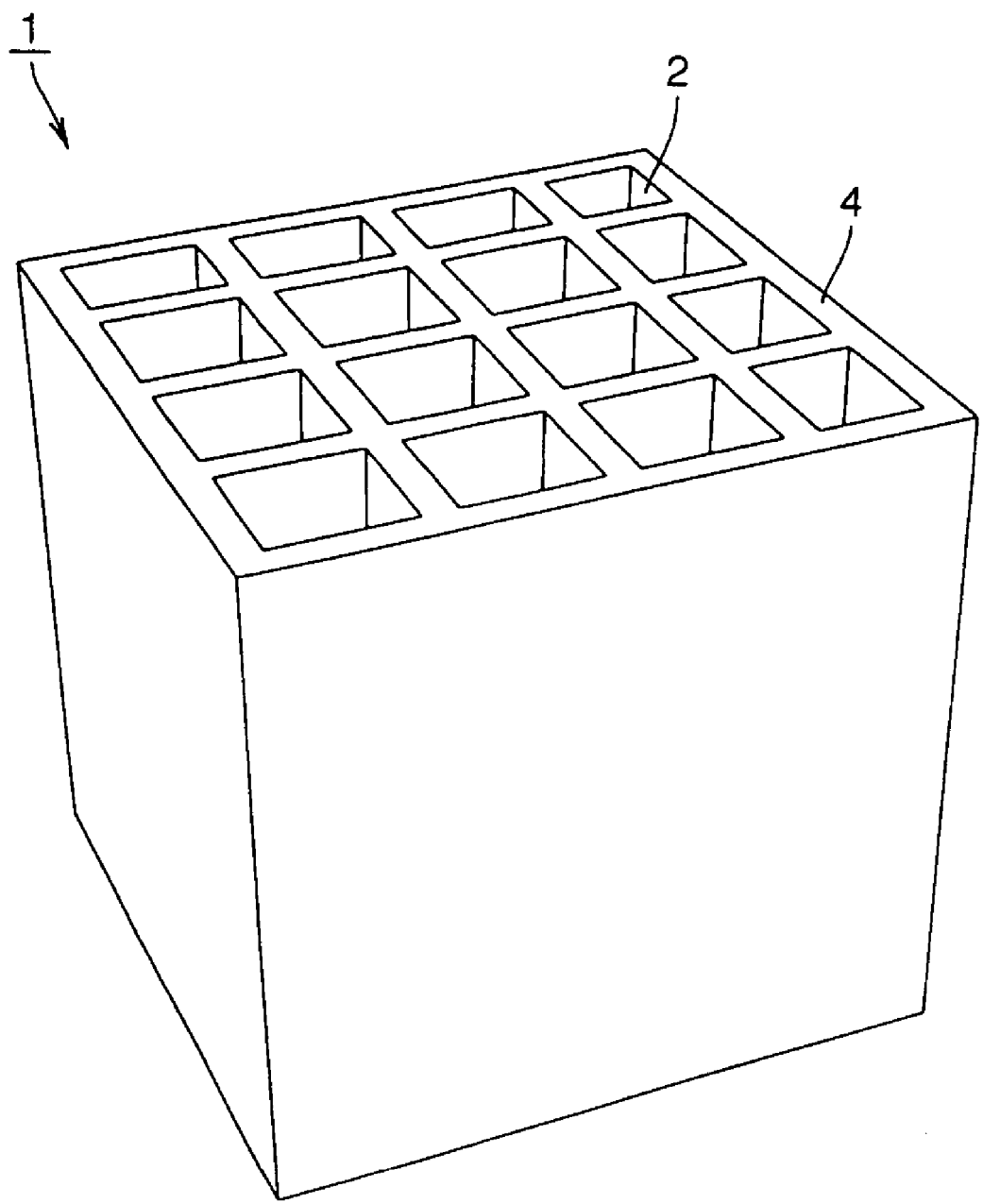
FIG. 1 is a perspective view showing a composite body for absorbing an electromagnetic wave in an embodiment of the present invention.
Figure 2:
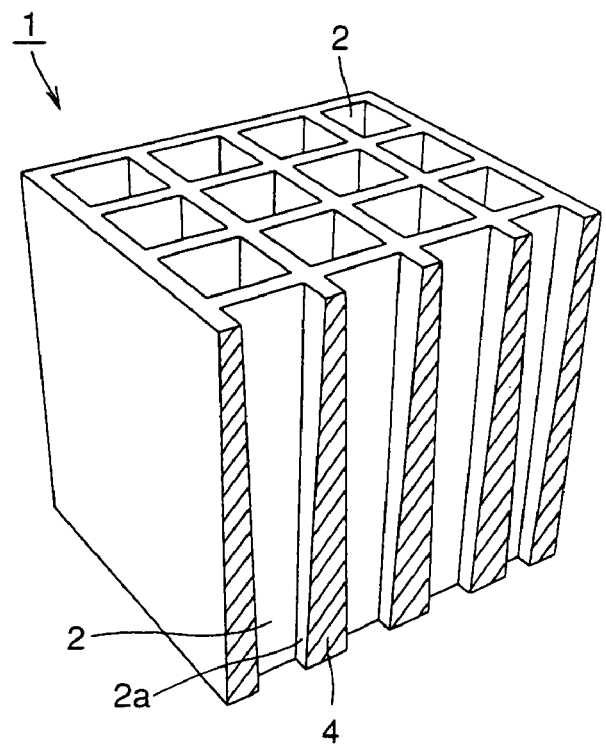
FIG. 2 is a partial, cross-sectional, perspective view of the composite body for absorbing an electromagnetic wave shown in FIG. 1 when seen from a top face.
Figure 3:
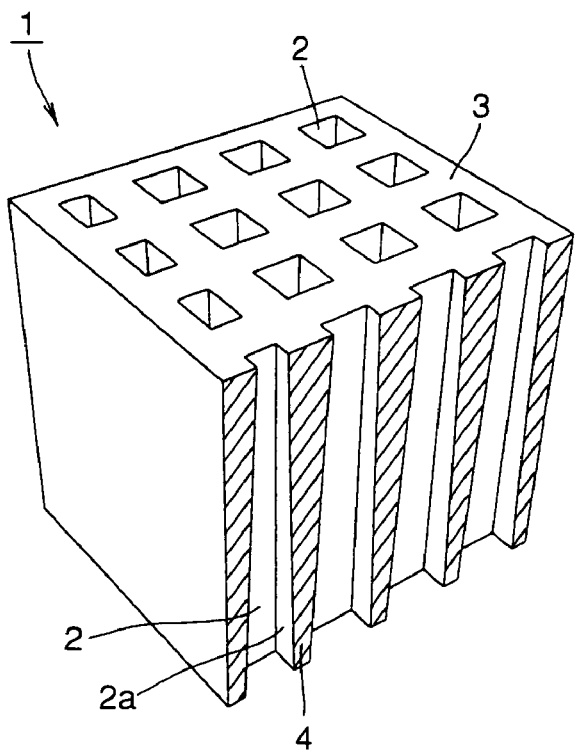
FIG. 3 is a partial, cross-sectional, perspective view of the composite body for absorbing an electromagnetic wave shown in FIG. 1 when seen from a bottom face.

As shown in FIGS. 1-3, a composite body 1 for absorbing an electromagnetic wave according to the present embodiment includes a body, a plurality of bores 2 provided to penetrate the body from a top face to a bottom face, and a wall portion 4 forming the body.

As shown in FIGS. 2 and 3, bore 2 at the top face of the body has a larger cross-sectional area (cross-sectional area of bore 2 in a direction orthogonal to the direction of a height of composite body 1 for absorbing an electromagnetic wave from a bottom face 3 to the top face) than bore 2 at bottom face 3. As shown in FIGS. 2 and 3, a wall of the body defining bore 2 is formed of tapered planes (inclined planes) 2a.

Since bore 2 is formed of tapered planes 2a, both of an electromagnetic wave incident into bore 2 and an electromagnetic wave reflecting in bore 2 can be made incident on tapered planes 2a with high probability. Accordingly, it is possible to improve electromagnetic wave absorbing performance of composite body 1 for absorbing an electromagnetic wave. Particularly, bore 2 can be made deeper by increasing the height of composite body 1 for absorbing an electromagnetic wave, which makes the above-described effect significant.

If bore 2 has a portion located between the top face and bottom face 3 of the body and having a smaller cross-sectional area than bore 2 at the top face of the body, composite body 1 for absorbing an electromagnetic wave is thought to be able to exhibit improved electromagnetic wave absorbing performance. Therefore, tapered planes 2a may not be continuous, and a wall of the body defining bore 2 may be formed of a plane other than the tapered planes. It may also be possible to adopt the shape of the bore whose opening area is initially reduced and then increased from the top face to the bottom face 3 of the body.

As shown in FIGS. 1-3, composite body 1 for absorbing an electromagnetic wave according to the present embodiment includes a plurality of unit cells each internally having a single bore extending from the top face to bottom face 3. Each of the unit cells refers to a unit structure forming at least a part of composite body 1 for absorbing an electromagnetic wave. For the example in FIGS. 1-3, a wall portion structure (frame body), which has an approximately rectangular parallelepiped shape and internally has a single bore 2, corresponds to the unit cell.

Figure 18:
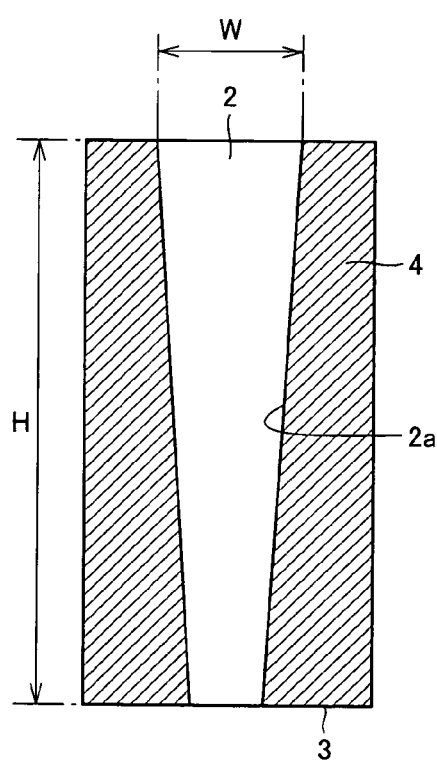
FIG. 18 is a cross-sectional view showing a unit cell of the type of composite body for absorbing an electromagnetic wave shown in FIG. 1.

FIG. 18 shows a structural example of the unit cell. As shown in FIG. 18, a wall of the unit cell defining a single bore 2 is formed of inclined planes, and bore 2 at the top face has a cross-sectional area larger than that of bore 2 obtained by cutting the unit cell, which is located more adjacently to bottom face 3 than to the top face, in a direction orthogonal to a direction along which bore 2 extends (direction of a height).

A height H of the unit cell from bottom face 3 to the top face is preferably made as large as possible. However, if the height is approximately at least 1.2-1.4 times and approximately at most 10 times as large as the maximum width W of bore 2 at the top face of the unit cell, it is possible to form composite body 1 for absorbing an electromagnetic wave by injection molding with high yields, while ensuring excellent electromagnetic wave absorbing performance. Preferably, height H is approximately at least 2 times and approximately at most 6 times as large as maximum width W, and more preferably, height H is approximately at least 3.5 times and approximately at most 6 times as large as maximum width W.

Another example of the shape of composite body 1 for absorbing an electromagnetic wave will now be described in reference to FIGS. 4 and 5.

Figure 4:
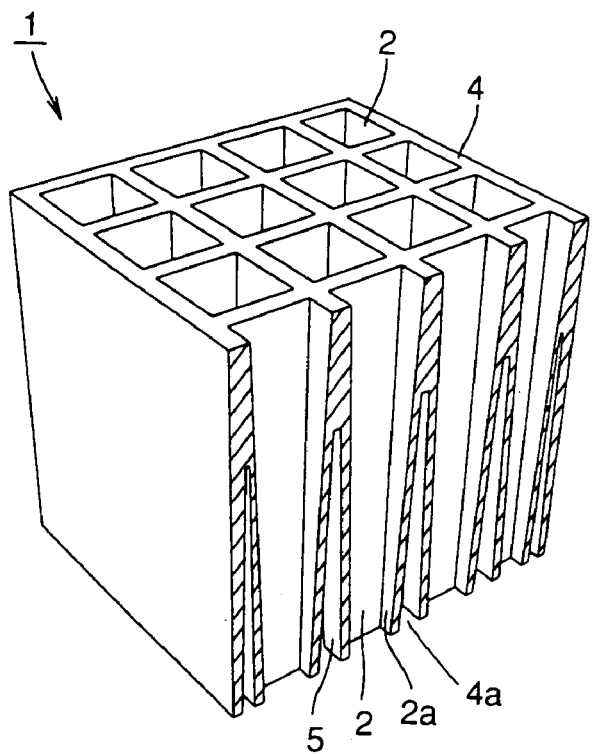
FIG. 4 is a partial, cross-sectional, perspective view of a composite body for absorbing an electromagnetic wave in another embodiment of the present invention when seen from a top face.
Figure 5:
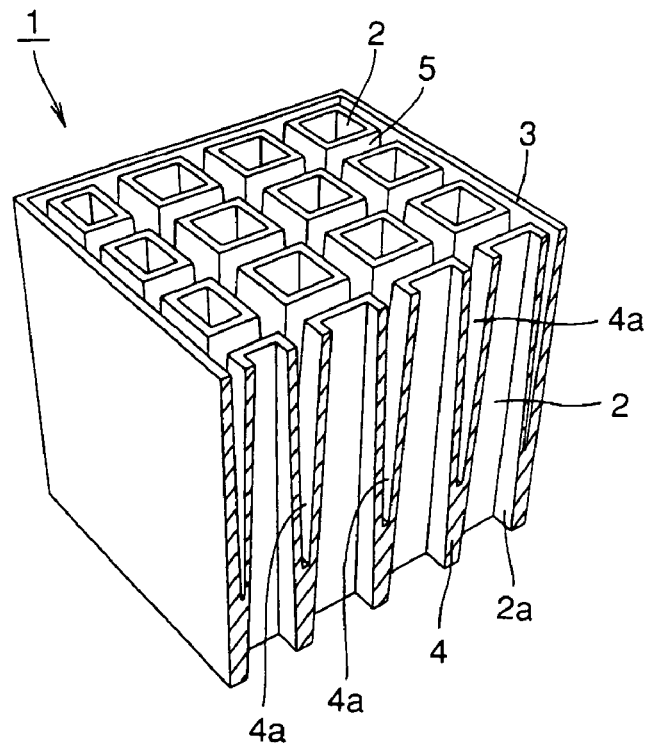
FIG. 5 is a partial, cross-sectional, perspective view of the composite body for absorbing an electromagnetic wave shown in FIG. 4 when seen from a bottom face.
Figure 6:
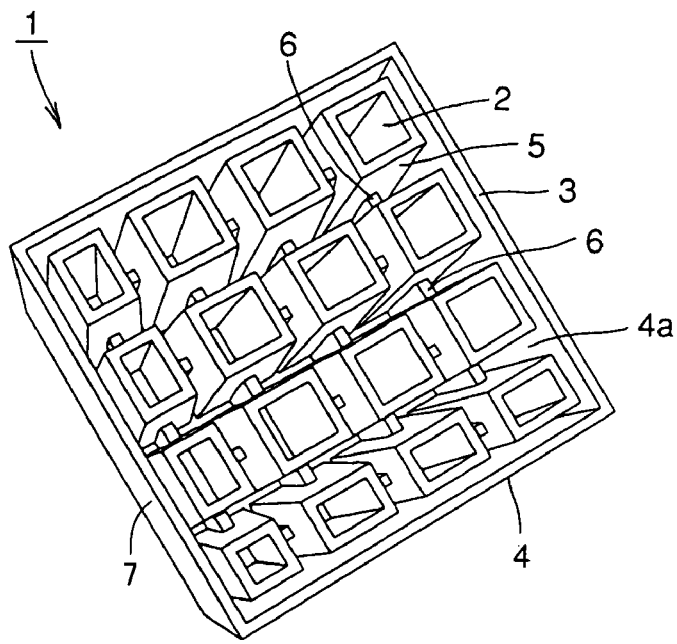
FIG. 6 is a perspective view of a composite body for absorbing an electromagnetic wave in still another embodiment of the present invention when seen from a bottom face.
Figure 7:
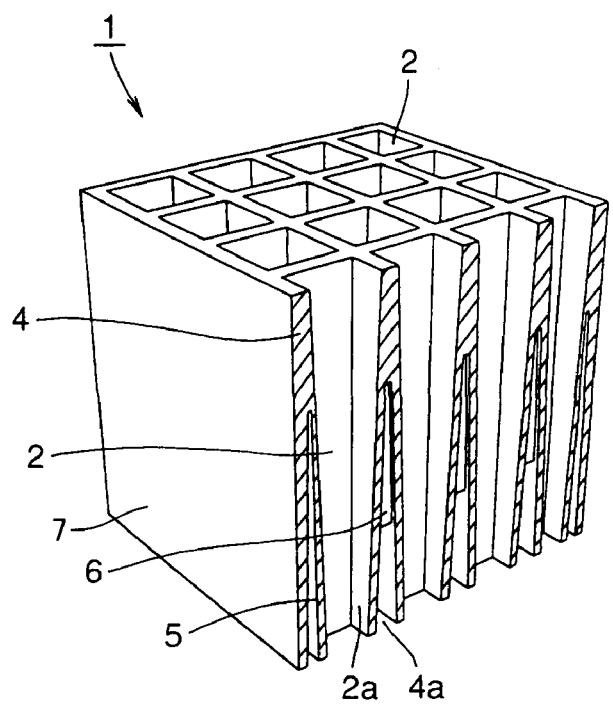
FIG. 7 is a partial, cross-sectional, perspective view of the composite body for absorbing an electromagnetic wave shown in FIG. 6 when seen from a top face.
Figure 8:
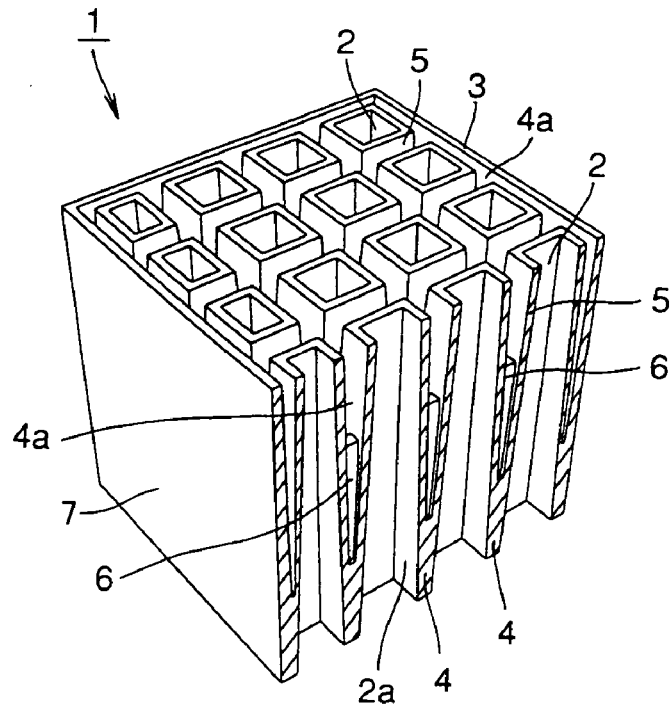
FIG. 8 is a partial, cross-sectional, perspective view of the composite body for absorbing an electromagnetic wave shown in FIG. 6 when seen from a bottom face.
Figure 9:
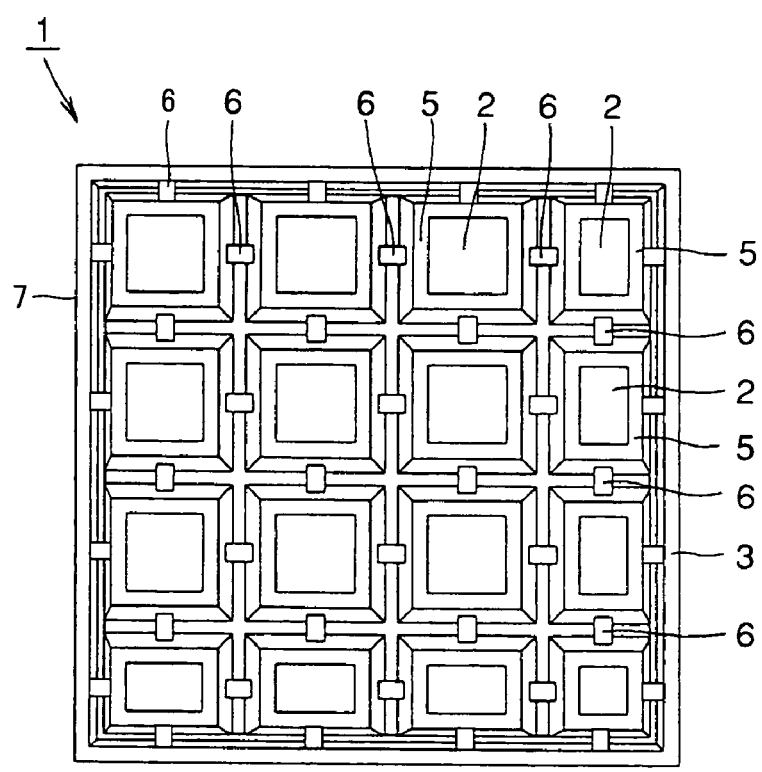
FIG. 9 is a bottom view of the composite body for absorbing an electromagnetic wave shown in FIG. 6.

As shown in FIGS. 4 and 5, the present example has a concave portion 4a provided around an opening of bore 2 at bottom face 3 of composite body 1 for absorbing an electromagnetic wave. Namely, a concave portion extending from the bottom face to the top face of the unit cell is provided. Other structures are basically the same with the case shown in FIGS. 1-3.

When tapered planes 2a are formed as shown in FIGS. 2 and 3, a thickness of wall portion 4 is increased in the neighborhood of bottom face 3. Therefore, by providing a concave portion 4a as described above, it is possible to reduce the thickness of wall portion 4 of composite body 1 for absorbing an electromagnetic wave in the neighborhood of bottom face 3, reduce the weight of composite body 1 for absorbing an electromagnetic wave, and also improve its electromagnetic wave absorbing performance.

In doing so, as shown in FIG. 5, it is preferable to surround bore 2 with concave portion 4a and form a cylindrical portion (hollow core) 5 surrounding bore 2 located at bottom face 3. In other words, it is preferable to form a cylindrical portion surrounding the bore at the bottom face 3 of the unit cell. Accordingly, it is possible to further reduce the weight of composite body 1 for absorbing an electromagnetic wave.

The same number of cylindrical portions 5 as bores 2 are provided at the bottom face of composite body 1 for absorbing an electromagnetic wave, and are spaced apart from each other. By setting the thickness of wall portion 4 forming cylindrical portion 5 to be approximately equal to that of other portions of wall portion 4, the entire composite body 1 for absorbing an electromagnetic wave can be made uniform in thickness, which makes it easy to form the composite body by injection molding, and can also improve electromagnetic wave absorbing performance.

Still another example of the shape of composite body 1 for absorbing an electromagnetic wave will now be described in reference to FIGS. 6-9.

In the example, as shown in FIGS. 6-9, a rib (connecting portion) 6 is provided to connect cylindrical portions 5 together, and connect cylindrical portions 5 to an external wall 7. Other structures are basically the same as in the case shown in FIGS. 4 and 5. As such, by providing rib 6 for connecting cylindrical portions 5, it is possible to prevent cylindrical portions 5 from falling down and improve the property of maintaining the shape of composite body 1 for absorbing an electromagnetic wave.

Figure 10:
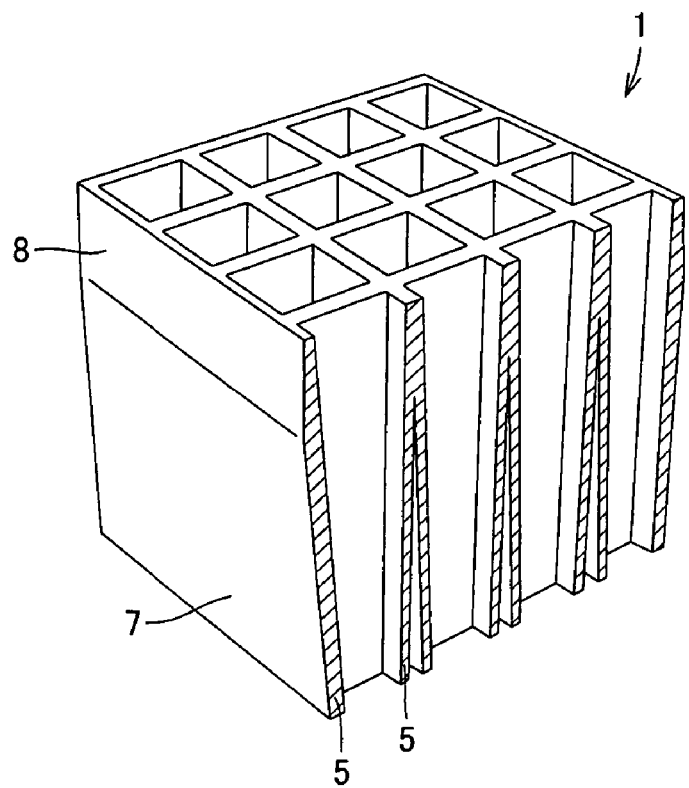
FIG. 10 is a partial, cross-sectional, perspective view of a composite body for absorbing an electromagnetic wave in a further embodiment of the present invention.

As shown in FIG. 10, it is also possible to provide a structure in which external wall portion 7 is integrated into cylindrical portions 5. External wall portion 7 typically has a tapered shape inclined at a given angle with respect to a direction orthogonal to the top face or the bottom face of composite body 1 for absorbing an electromagnetic wave (vertical direction: direction of a height). However, as shown in FIG. 10, it may be possible to provide a straight portion 8 extending in the vertical direction with no slope, at a portion of external wall portion 7.

Straight portion 8 may possibly be provided in the neighborhood of the top face or the bottom face of composite body 1 for absorbing an electromagnetic wave. It is preferable to provide straight portion 8 to entirely surround external wall portion 7. However, it may be possible to selectively provide straight portion 8 at least at portions, which are located at the surface of external wall portion 7 and are to be placed opposite to each other.

Figure 11:
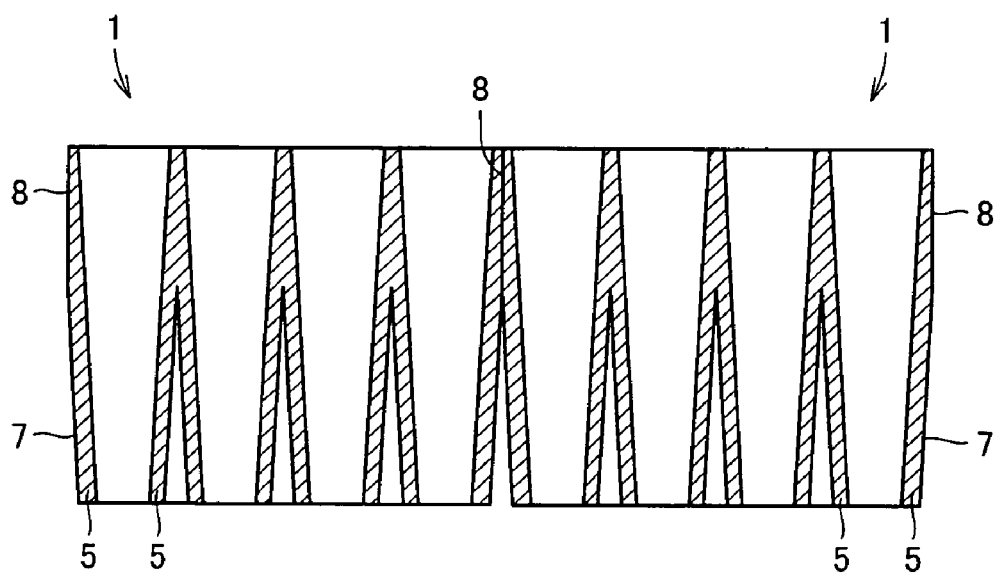
FIG. 11 is a cross-sectional view of the composite bodies for absorbing an electromagnetic wave shown in FIG. 10 in an arranged state.

By providing straight portion 8 as described above, it is possible to arrange a plurality of products with straight portions 8 abutting each other as shown in FIG. 11. Accordingly, it is possible to obtain a composite body for absorbing an electromagnetic wave having a shape of a large panel.

Figure 12:
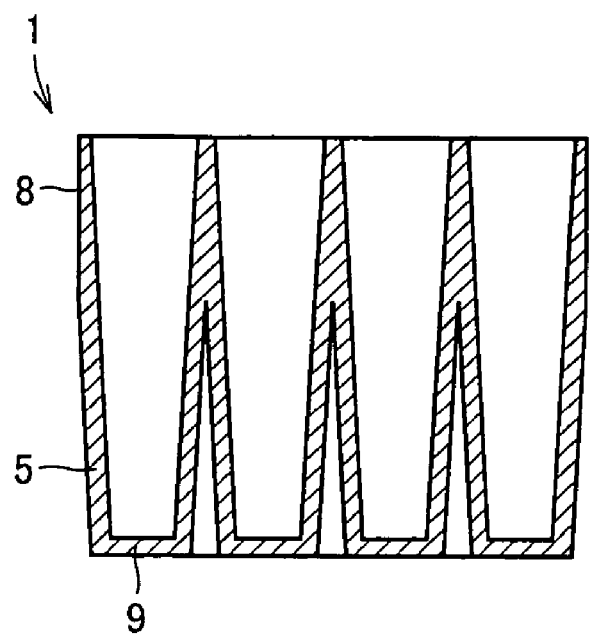
FIG. 12 is a cross-sectional view of a composite body for absorbing an electromagnetic wave in a further embodiment of the present invention.

As shown in FIG. 12, it may be possible to provide a bottom portion 9 for closing one of the opening ends of cylindrical portion 5. In this case, it is estimated that electromagnetic wave absorbing performance can further be improved.

Figure 13:
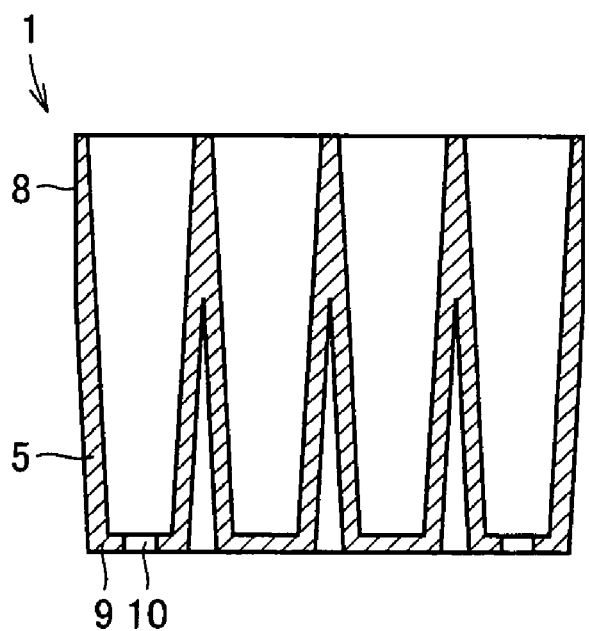
FIG. 13 is a cross-sectional view of a composite body for absorbing an electromagnetic wave in a further embodiment of the present invention.

As shown in FIG. 13, a bore 10 for inserting a fixing member such as a bolt or a screw may be formed at bottom portion 9. In this case, a fixing member such as a bolt or a screw can be fitted into bore 10, and it is possible to fix composite body 1 for absorbing an electromagnetic wave to a wall, for example, by using the fixing member.

A further example of the shape of composite body 1 for absorbing an electromagnetic wave will now be described in reference to FIGS. 14-17.

In each of the embodiments above, the top face of wall portion 4 located around bore 2 of composite body 1 for absorbing an electromagnetic wave is formed of a flat plane. However, it is preferable to reduce a flat area at the top face of wall portion 4 of composite body 1 for absorbing an electromagnetic wave. For example, concave and convex portions or an inclined plane may be provided at the top face of wall portion 4 to reduce the flat area at the top face. By doing so, electromagnetic wave absorbing performance can be improved.

Figure 14:
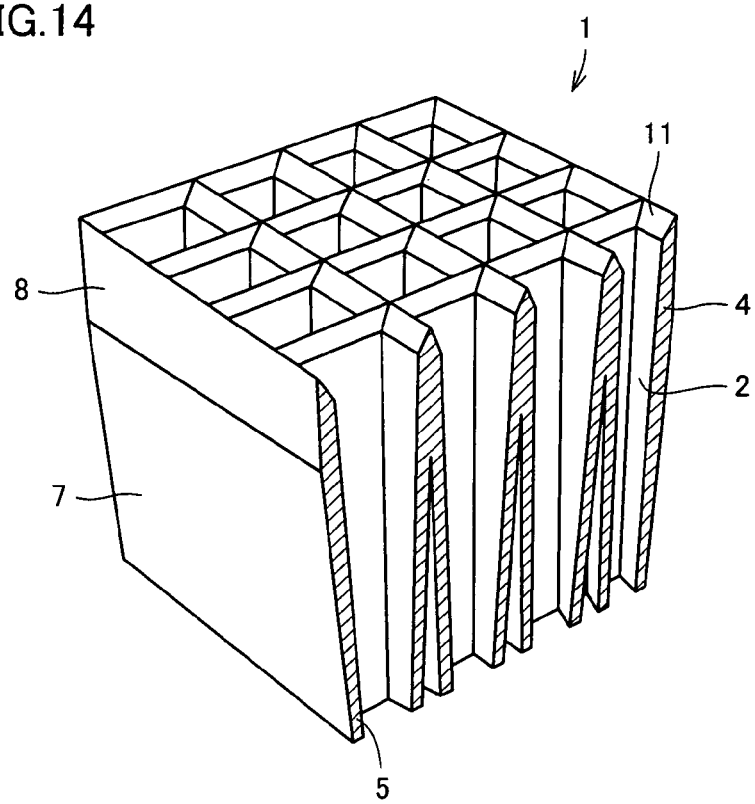
FIG. 14 is a partial, cross-sectional, perspective view of a composite body for absorbing an electromagnetic wave in a further embodiment of the present invention.
Figure 15:
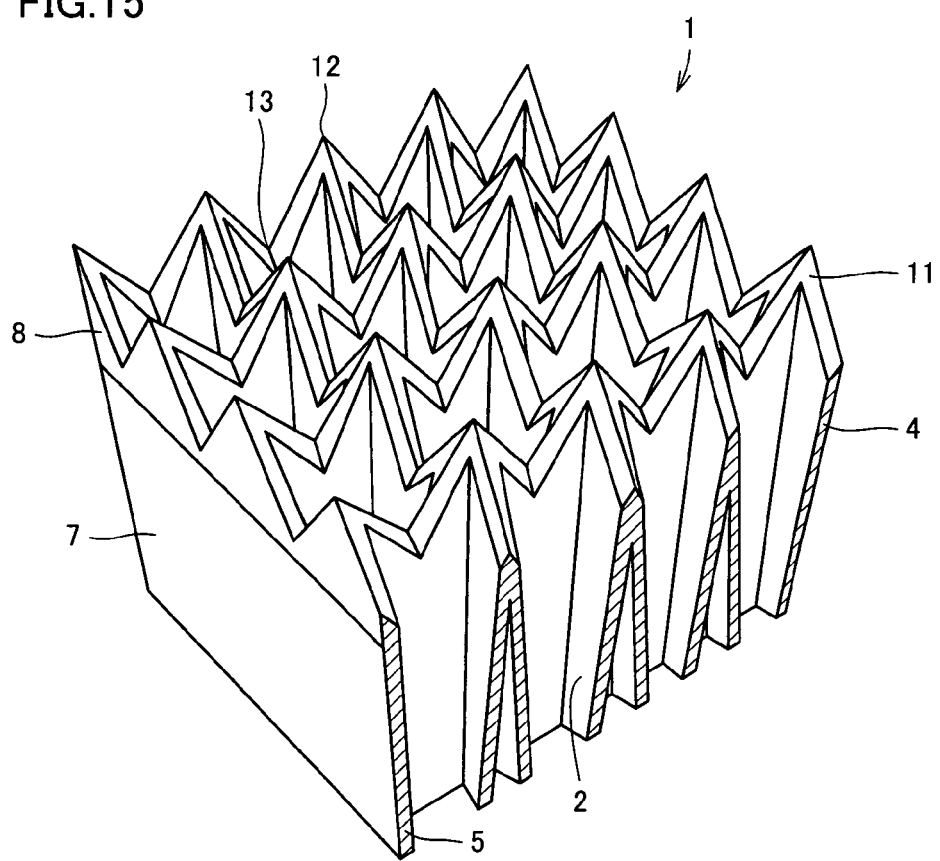
FIG. 15 is a partial, cross-sectional, perspective view of a composite body for absorbing an electromagnetic wave in a further embodiment of the present invention.
Figure 16:
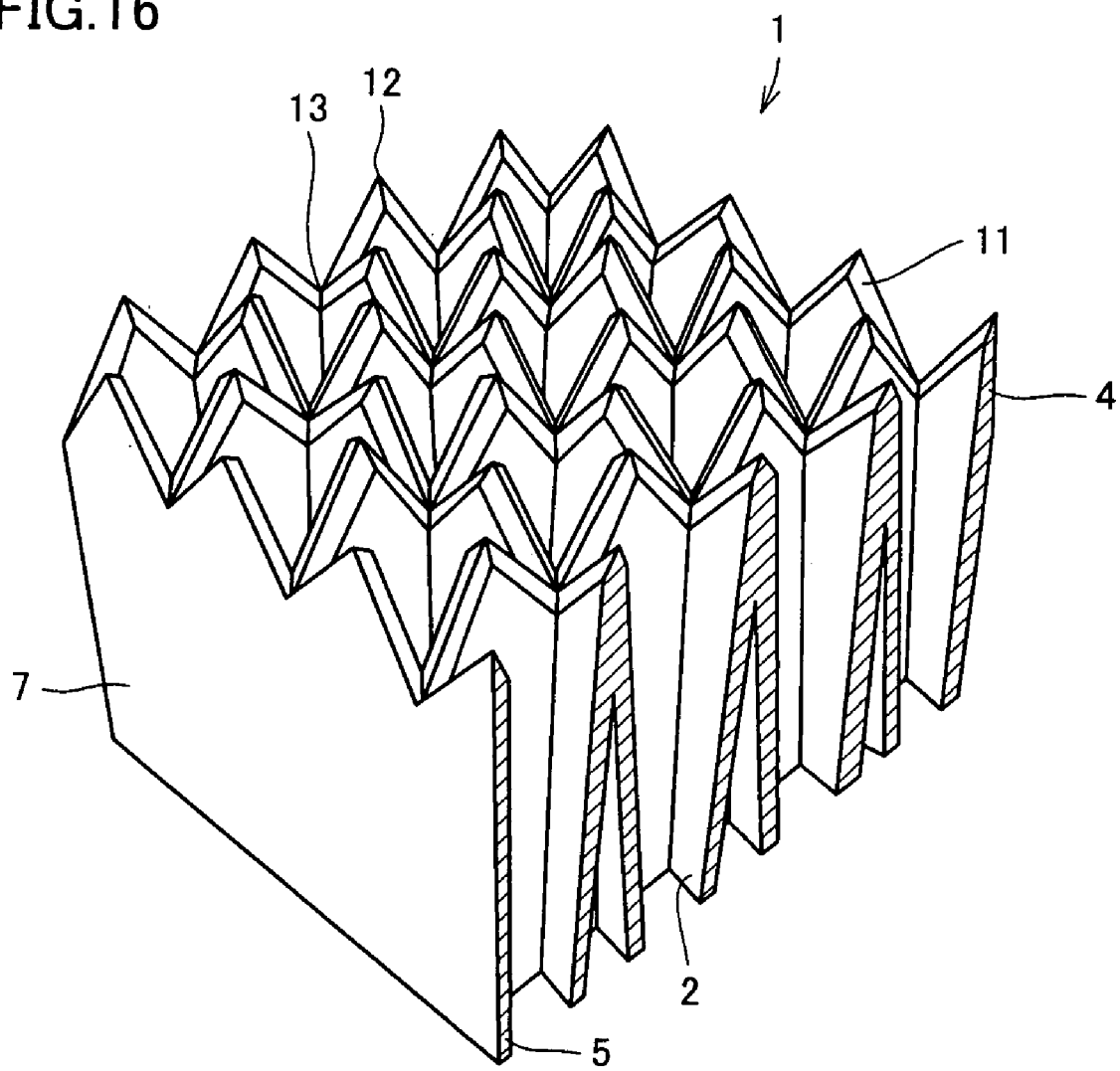
FIG. 16 is a partial, cross-sectional, perspective view of a composite body for absorbing an electromagnetic wave in a further embodiment of the present invention.

More specifically, as shown in FIG. 14, an inclined plane 11 may be provided at the top face of wall portion 4 to allow the top face of wall portion 4 to have a mountain-like shape. As shown in FIG. 15, the top face of wall portion 4 may take a mountain-like shape defined by a convex portion 12 having a peak at a crossing point of wall portions 4 and a concave portion 13 having a bottom at a midpoint of the crossing points, and may be provided with inclined plane 111 as in the case of FIG. 14. As shown in FIG. 16, the top face of wall portion 4 may take a mountain-like shape defined by concave portion 13 having a bottom at the crossing point of wall portions 4 and convex portion 12 having a peak at the midpoint of the crossing points, and may be provided with inclined plane 11 as in the case of FIG. 14.

The shape shown in FIG. 15 is described in detail. While convex portion 12 is provided at a top face of an intersection of wall portions 4, concave portion 13 is provided at the top face of wall portion 4 located between the intersections. Accordingly, concave portion 13 and convex portion 12 form a V-shaped portion at the top face of wall portion 4, and a longitudinally central portion at the top face of wall portion 4 is the most concave. More specifically, a pair of inclined planes 11 arranged in a direction of the thickness of wall portion 4 (direction orthogonal to a longitudinal direction of the top face of wall portion 4) are combined to form the top face of wall portion 4 such that a central portion in a direction of the thickness of wall portion 4 protrudes most upwardly at the top face of wall portion 4, to form a V-shaped ridge extending in the longitudinal direction of the top face of wall portion 4 at a junction of the pair of inclined planes 11 (at the peak of a mountain-like shape). At the intersection of wall portions 4, four ridges at the top faces of wall portions 4 intersect, and the crossing point of the four ridges corresponds to the peak of convex portion 12.

In addition to the examples above, various modifications may be considered. In the examples shown in FIGS. 15 and 16, for example, a single bottom or a single peak is provided between the crossing points of wall portions 4. However, two or more bottoms or peaks may be provided there. By providing a cut of any shape other than the V-shape at the top face of wall portion 4 to provide concave and convex portions, it may be possible to reduce the flat area at the top face.

Figure 17:
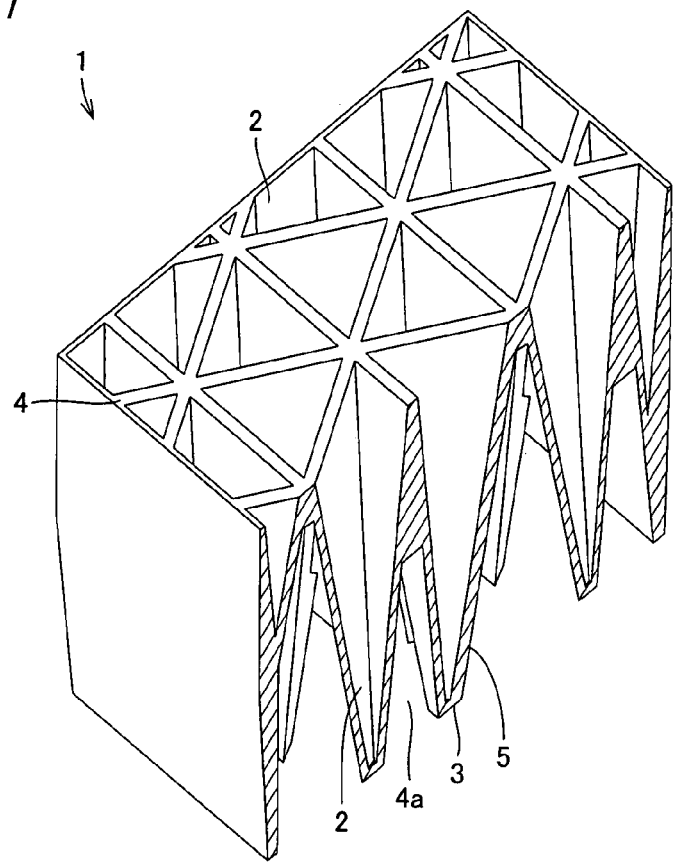
FIG. 17 is a partial, cross-sectional, perspective view of a composite body for absorbing an electromagnetic wave in a further embodiment of the present invention when seen from a top face.

As shown in FIG. 17, bore 2 may not penetrate composite body 1 for absorbing an electromagnetic wave. In other words, bore 2 may be open at either of the top face or bottom face 3 of composite body 1 for absorbing an electromagnetic wave. In addition, the opening of bore 2 may have a triangular shape as shown in the example of FIG. 17 instead of a rectangular shape, and it is possible to adopt any opening shape such as a polygonal shape having more than four corners, a circular shape, or an oval shape. Other structures are basically similar to the example shown in FIGS. 4 and 5. By closing the end of bore 2 as in the present example, it is possible to prevent an electromagnetic wave from passing through bore 2, which can further improve electromagnetic wave absorbing performance.

A method of manufacturing the composite body for absorbing an electromagnetic wave according to the present embodiments will now be described.

Initially, a thermoplastic resin such as a polypropylene resin is blended with approximately 20-60% by volume of soft magnetic material powder such as Permalloy (R) powder, and approximately 1-9% by volume of a molding assistant such as stearic acid and a kneading assistant such as a silane type, aluminate type, or titanate type surface modification agent to be kneaded together. The kneaded material is injection-molded into a desired shape, and the injection-molded compact is cooled for solidification. Through such steps, it is possible to manufacture composite body 1 for absorbing an electromagnetic wave according to the present embodiments.

In the method of manufacturing composite body 1 for absorbing an electromagnetic wave according to the present embodiments, the steps of degreasing and sintering are not performed after the step of injection molding as described above. Thus, it is possible to avoid degreasing cracks and quenching cracks. Accordingly, it is possible to increase yields and simplify the process of manufacturing composite body 1 for absorbing an electromagnetic wave as well.

Examples according to the present invention will now be described in reference to Tables 1-11 and FIGS. 19-22.

EXAMPLE 1

A polypropylene resin was fed into a thermal and pressure kneader along with Permalloy (R) powder whose surface was subjected to coupling treatment to obtain affinity to the thermoplastic resin so that its mean particle diameter converted to spherical diameter was approximately 30-40 μm, and whose particles had a ratio (L/T) of maximum length (L) and thickness (T) of approximately 3-10, at the blending ratios shown in Table 1 below. The material above was heated to approximately 180-210° C. and kneaded for approximately 60 minutes under a pressure that could cause shearing force for kneading. The compound material that was kneaded uniformly and had an apparent viscosity of approximately 100-400 Pa·S was pelletized with a pelletizer. The pelletized material to be molded was fed into an injection molder to which a mold for injection molding was attached, to be heated and plasticized at approximately 180-230° C. The material was then injected into the mold at a high pressure of approximately 70 MPa-140 MPa and cooled for solidification. Thereafter, the compact was removed from the mold, and it was possible to obtain composite bodies 1 and 2 for absorbing an electromagnetic wave.

TABLE 1

| | Blending Ratio (vol. %) | |
|---|---|---|
| | electromagnetic wave absorber 1 | electromagnetic wave absorber 2 |
| Permalloy (R) powder | 44.2 | 50.2 |
| polypropylene | 50.0 | 41.0 |
| kneading assistant, molding assistant, and others | 5.8 | 8.8 |
| mean particle diameter converted to spherical diameter | 30.0 | 40.0 |

EXAMPLE 2

By using a method similar to that of Example 1, it was possible to obtain composite bodies 3-9 for absorbing an electromagnetic wave with the blending ratios shown in Tables 2-4 below.

TABLE 2

| | Blending Ratio (vol. %) | | | |
|---|---|---|---|---|
| | electromagnetic wave absorber 3 | electromagnetic wave absorber 4 | electromagnetic wave absorber 5 | electromagnetic wave absorber 6 |
| Permalloy (R) powder | 39.7 | 36.6 | 39.0 | 20.0 |
| methylpentene polymer | 33.7 | 45.9 | 44.4 | 66.8 |
| polybutene-1 | 20.2 | 12.6 | 10.2 | 8.6 |

TABLE 2-continued

| | Blending Ratio (vol. %) | | | |
|---|---|---|---|---|
| | electromagnetic wave absorber 3 | electromagnetic wave absorber 4 | electromagnetic wave absorber 5 | electromagnetic wave absorber 6 |
| kneading assistant, molding assistant and others | 6.4 | 4.9 | 6.4 | 4.6 |
| mean particle diameter converted to spherical diameter | 25.0 | 40.0 | 25.0 | 40.0 |

TABLE 3

| | Blending Ratio (vol. %) | |
|---|---|---|
| | electromagnetic wave absorber 7 | electromagnetic wave absorber 8 |
| Permalloy (R) powder | 39.0 | 39.0 |
| methylpentene polymer | 44.5 | 54.6 |
| polypropylene | 10.1 | 0.0 |
| kneading assistant, molding assistant and others | 6.4 | 6.4 |
| mean particle diameter converted to spherical diameter | 30.0 | 30.0 |

TABLE 4

| | Blending Ratio (vol. %) |
|---|---|
| | electromagnetic wave absorber 9 |
| Permalloy (R) powder | 39.7 |
| nylon12 | 55.7 |
| kneading assistant, molding assistant and others | 4.6 |
| mean particle diameter converted to spherical diameter | 25.0 |

EXAMPLE 3

A methylpentene polymer resin and a polypropylene resin were fed into a thermal and pressure kneader along with gas-atomized spherical Permalloy (R) powder whose mean particle diameter converted to spherical diameter is approximately 37 μm, at the blending ratio shown in Table 5 below. The material above was heated to approximately 240-260° C. and kneaded for approximately 40 minutes under a pressure that could cause shearing force for kneading. The compound material that was uniformly kneaded and had a given viscosity was pelletized with a pelletizer. The pelletized material to be molded was fed into an injection molder to which a mold for injection molding was attached, to be heated and plasticized at approximately 200-260° C. The material was then injected into the mold at a high pressure of approximately 70 MPa-140 MPa and cooled for solidification. Thereafter, the compact was removed from the mold, and it was possible to obtain composite body 10 for absorbing an electromagnetic wave.

TABLE 5

| | Blending Ratio (vol. %) |
|---|---|
| | electromagnetic wave absorber 10 |
| Permalloy (R) powder | 57.7 |
| methylpentene polymer | 32.4 |
| polypropylene | 7.4 |
| molding assistance and others | 2.5 |
| mean particle diameter converted to spherical diameter | 37 |

EXAMPLE 4

A methylpentene polymer resin and a polypropylene resin were fed into a thermal and pressure kneader along with gas-atomized spherical Stellite (R) 6 powder and Stellite (R) 12 powder both having a particle diameter of approximately at most 25 μm, at the blending ratio shown in Table 6 below. The material above was heated to approximately 240-260° C. and kneaded for approximately 40 minutes under a pressure that could cause shearing force for kneading. The compound material that was uniformly kneaded and had a given viscosity was pelletized with a pelletizer. The pelletized material to be molded was fed into an injection molder to which a mold is attached, to be heated and plasticized at approximately 200-250° C. The material was then injected into the mold at a high pressure of approximately 70 MPa-140 MPa and cooled for solidification. Thereafter, the compact was removed from the mold, and it was possible to obtain composite bodies 11 and 12 for absorbing an electromagnetic wave.

TABLE 6

| | Blending Ratio (vol. %) | |
|---|---|---|
| | electromagnetic wave absorber 11 | electromagnetic wave absorber 12 |
| Stellite (R) | 55.0 | 57.0 |
| methylpentene polymer | 0.0 | 33.0 |
| polypropylene | 43.2 | 7.5 |
| molding assistance and others | 1.8 | 2.5 |

By using a method similar to that of Examples 1-4, it was possible to obtain composite body 1 for absorbing an electromagnetic wave shown in FIGS. 14-16.

Composite bodies 1-12 for absorbing an electromagnetic wave obtained as described above were then subjected to a heat resistance test. The results will now be explained in reference to Table 7.

In the heat resistance test, the composite bodies for absorbing an electromagnetic wave were placed in a high-temperature thermostatic chamber at the given temperatures for the given hours shown in Table 7 below to observe dimensional change, deformation, and change in appearance, so as to determine the temperatures and the hours that would cause problematic changes in performance.

TABLE 7

| | 160° C. 3 hours | 170° C. 3 hours | 180° C. 3 hours | 190° C. 3 hours | 200° C. 3 hours |
|---|---|---|---|---|---|
| electromagnetic wave absorber 1 | good | | | | |
| electromagnetic wave absorber 2 | good | | | | |

TABLE 7-continued

| | 160° C. 3 hours | 170° C. 3 hours | 180° C. 3 hours | 190° C. 3 hours | 200° C. 3 hours |
|---|---|---|---|---|---|
| electromagnetic wave absorber 3 | good | good | good | | |
| electromagnetic wave absorber 4 | good | good | good | | |
| electromagnetic wave absorber 5 | good | good | good | good | |
| electromagnetic wave absorber 6 | good | good | good | good | |
| electromagnetic wave absorber 7 | good | good | good | good | good |
| electromagnetic wave absorber 8 | good | good | good | good | good |
| electromagnetic wave absorber 9 | good | good | good | | |
| electromagnetic wave absorber 10 | good | good | good | good | |
| electromagnetic wave absorber 11 | good | good | good | good | |
| electromagnetic wave absorber 12 | good | good | good | good | |

As shown in Table 7 above, almost all the composite bodies for absorbing an electromagnetic wave have heat resistant performance at 160° C. for 3 hours, which shows that the composite bodies for absorbing an electromagnetic wave according to the present examples have excellent heat resistant performance. Especially, composite body 7 for absorbing an electromagnetic wave, which is a blended type of methylpentene polymer and polypropylene, and composite body 8 for absorbing an electromagnetic wave, which is a simple substance type of methylpentene polymer, have an allowable temperature limit exceeding 200° C., showing that these composite bodies have particularly excellent heat resistant performance.

The strength test was performed by using a test piece fabricated by injection-molding the same material as composite body 1 for absorbing an electromagnetic wave in Example 1. The results will now be explained in reference to Table 8. In the strength test, tensile strength was tested in conformance with American Society For Testing and Materials (ASTM) D 638, and bending strength and flexural modulus were tested in conformance with ASTM D790. The results of the strength test are shown in Table 8.

TABLE 8

| | tensile strength: MPa | bending strength: MPa | flexural modulus: MPa |
|---|---|---|---|
| electromagnetic wave absorber 1 | 12.1 | 23.2 | 7350 |

As shown in Table 8, composite body 1 for absorbing an electromagnetic wave has excellent tensile strength, bending strength, and flexural modulus. It is believed that the composite body for absorbing an electromagnetic wave has a compressive strength that allows even a person weighing more than 80 kg to step onto the same with his/her shoes on, without being affected at all.

Other composite bodies 2-12 for absorbing an electromagnetic wave also use a simple substance of thermoplastic resin and a mixture containing the thermoplastic resin in Tables 9-11 and each of them has strength entirely satisfactory for practical use. Therefore, it is estimated that these composite bodies also have a compressive strength equal to that of composite body 1 for absorbing an electromagnetic wave.

TABLE 9

| methylpentene polymer (wt %) | polypropylene (wt %) | tensile strength (MPa) | bending strength (MPa) | flexural modulus (MPa) |
|---|---|---|---|---|
| 100 | 0 | 22.4 | 39.1 | 1430 |
| 90 | 10 | 22.0 | 39.2 | 1600 |
| 80 | 20 | 22.3 | 38.3 | 1520 |
| 70 | 30 | 22.5 | 37.0 | 1470 |
| 60 | 40 | 22.5 | 36.4 | 1450 |
| 50 | 50 | 22.3 | 34.7 | 1430 |
| 0 | 100 | 26.5 | 33.0 | 1420 |

TABLE 10

| methylpentene polymer (wt %) | polybutene-1 (wt %) | tensile strength (MPa) | bending strength (MPa) | flexural modulus (MPa) |
|---|---|---|---|---|
| 100 | 0 | 22.4 | 39.1 | 1430 |
| 90 | 10 | 20.2 | 30.3 | 1160 |
| 80 | 20 | 19.5 | 27.6 | 1130 |
| 70 | 30 | 19.1 | 25.4 | 1010 |
| 50 | 50 | 19.1 | 25.1 | 870 |

TABLE 11

| | tensile strength: MPa | bending strength: MPa | flexural modulus: MPa |
|---|---|---|---|
| nylon12 100 wt % | 20.6 | 22.6 | 350 |

Composite body 1 for absorbing an electromagnetic wave in Example 4 was tested on electromagnetic wave absorbing performance. The results will now be explained in reference to FIG. 19.

A network analyzer 851° C. available from HEWLETT PACKARD was used to irradiate an electric wave to the composite body for absorbing an electromagnetic wave at an incident angle of 45° to measure electromagnetic wave absorbing performance. The frequencies to be measured of the electric wave were separately measured according to the frequencies of antennas, namely, in a range of 33 GHz to 50 GHz, a range of 50 GHz to 65 GHz, and a range of 75 GHz to 110 GHz.

Figure 19:
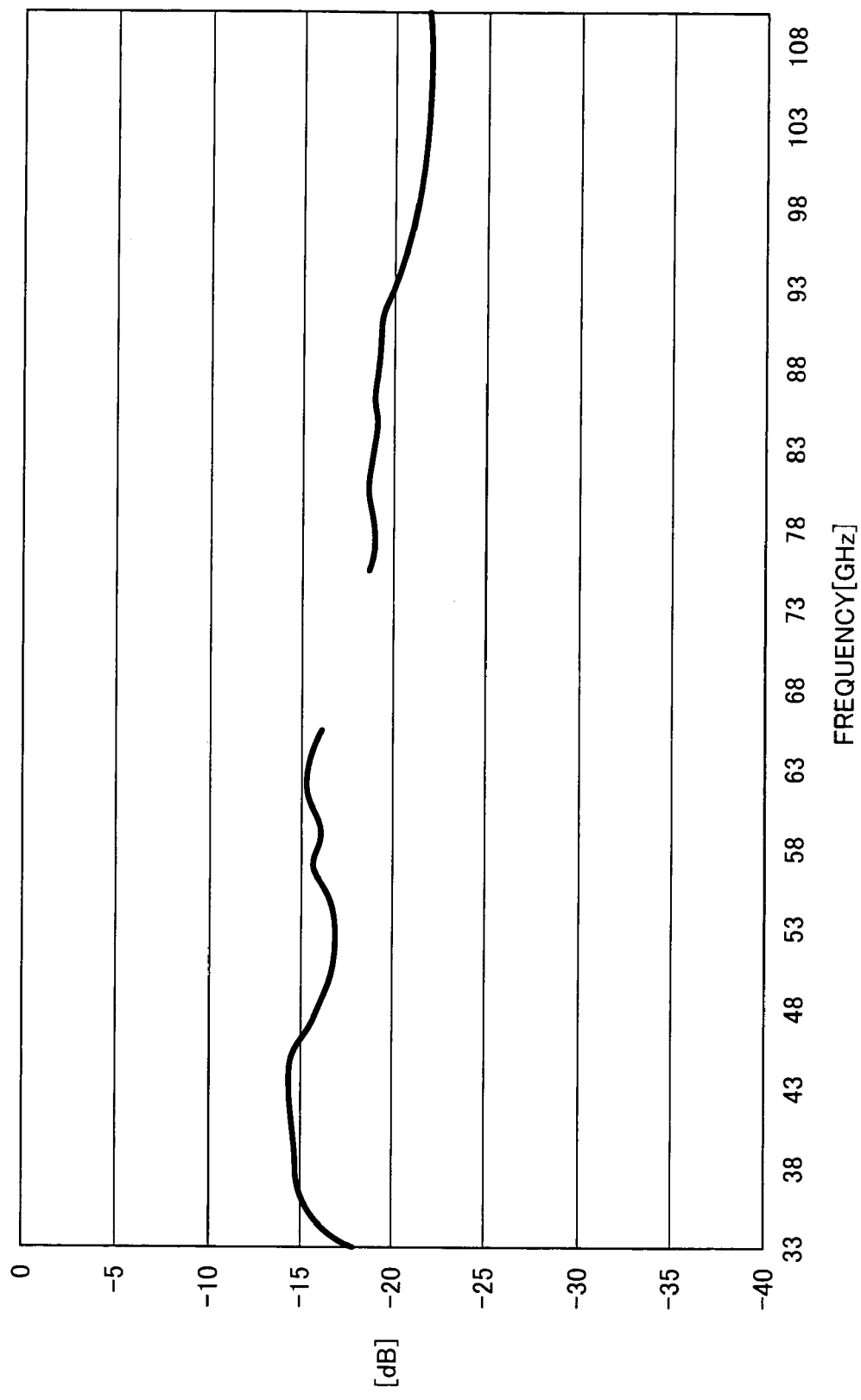
FIG. 19 is a chart showing electromagnetic wave absorbing performance of the composite body for absorbing an electromagnetic wave in Example 4 of the present invention.

FIG. 19 is a chart showing electromagnetic wave absorbing performance of composite body 11 for absorbing an electromagnetic wave. In FIG. 19, a vertical axis represents electromagnetic wave absorbing performance [dB].

As shown in FIG. 19, high electromagnetic wave absorbing performance of approximately at least 15 dB is recognized in a wide range of high frequencies. Especially in a frequency range of approximately at least 93 GHz, electromagnetic wave absorbing performance is found to exceed approximately 20 dB. The composite bodies for absorbing an electromagnetic wave in other examples are found to have similar electromagnetic wave absorbing performance.

Composite bodies 1 for absorbing an electromagnetic wave having the structures shown in FIGS. 14-16 were fabricated by the method as in Example 4. When the electromagnetic wave absorbing performance thereof was measured with the technique similar to the above-described one, the results shown in FIGS. 20-22 were obtained.

Figure 20:
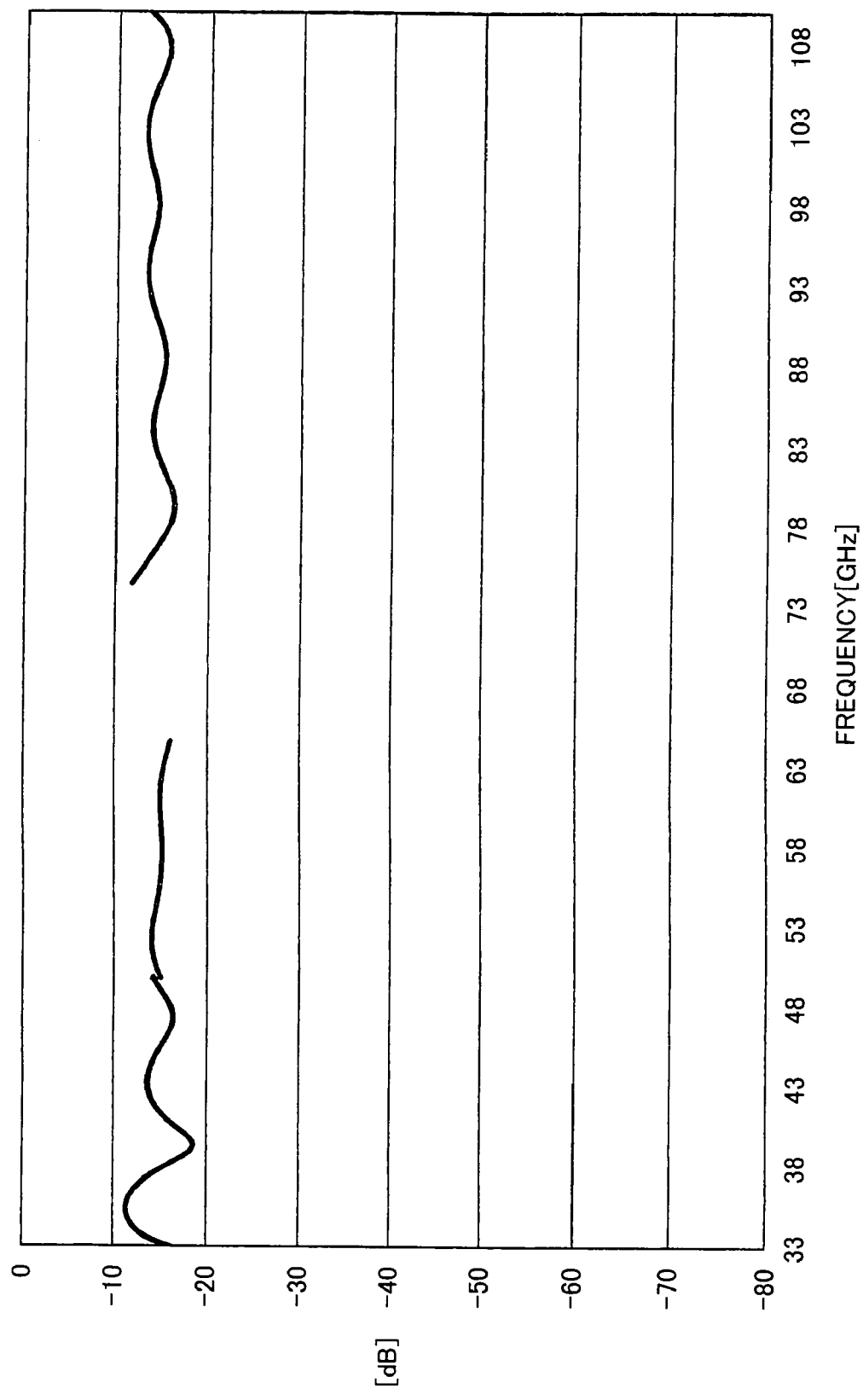
FIG. 20 is a chart showing electromagnetic wave absorbing performance of a composite body for absorbing an electromagnetic wave having the shape shown in FIG. 14.
Figure 21:
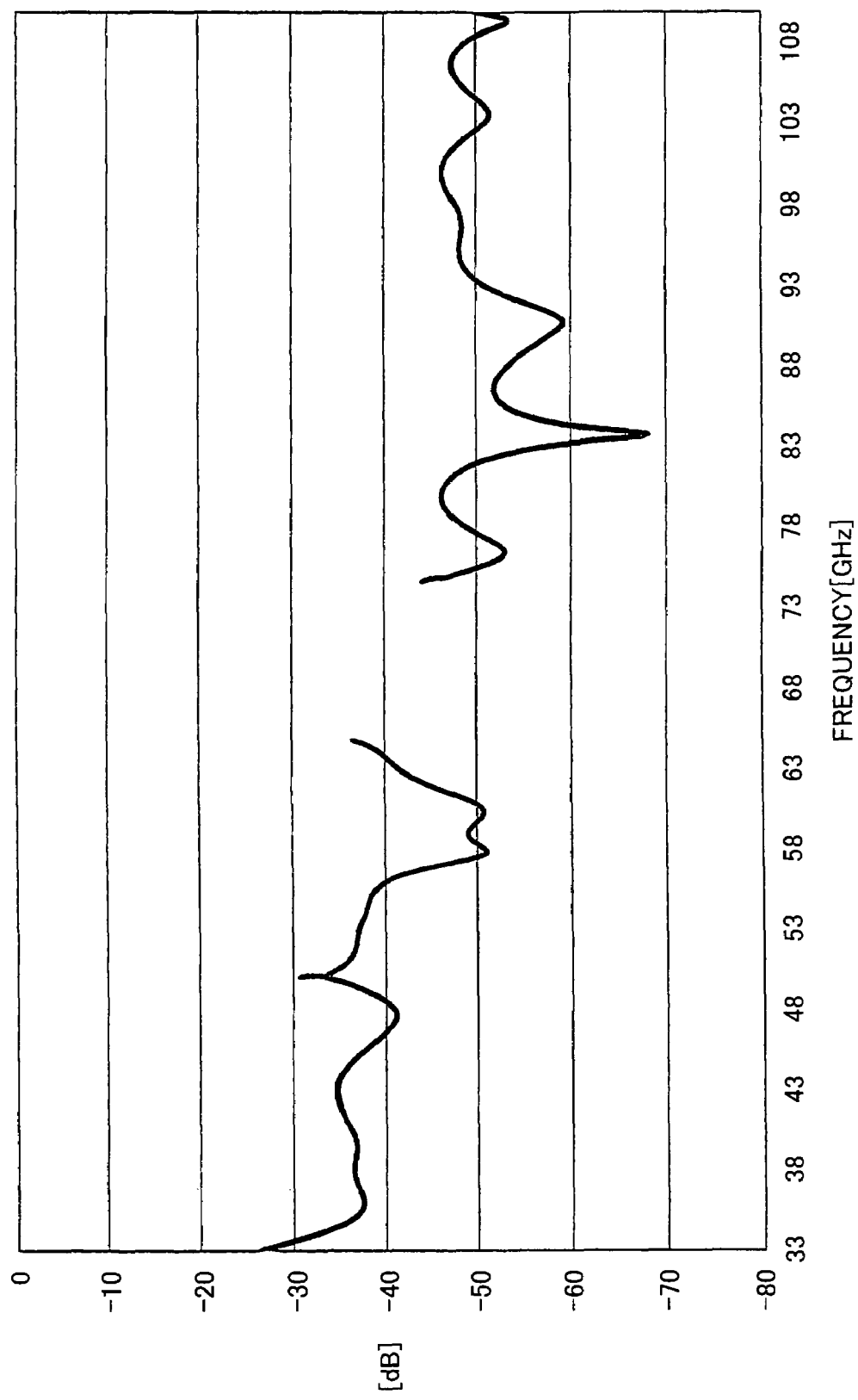
FIG. 21 is a chart showing electromagnetic wave absorbing performance of a composite body for absorbing an electromagnetic wave having the shape shown in FIG. 15.
Figure 22:
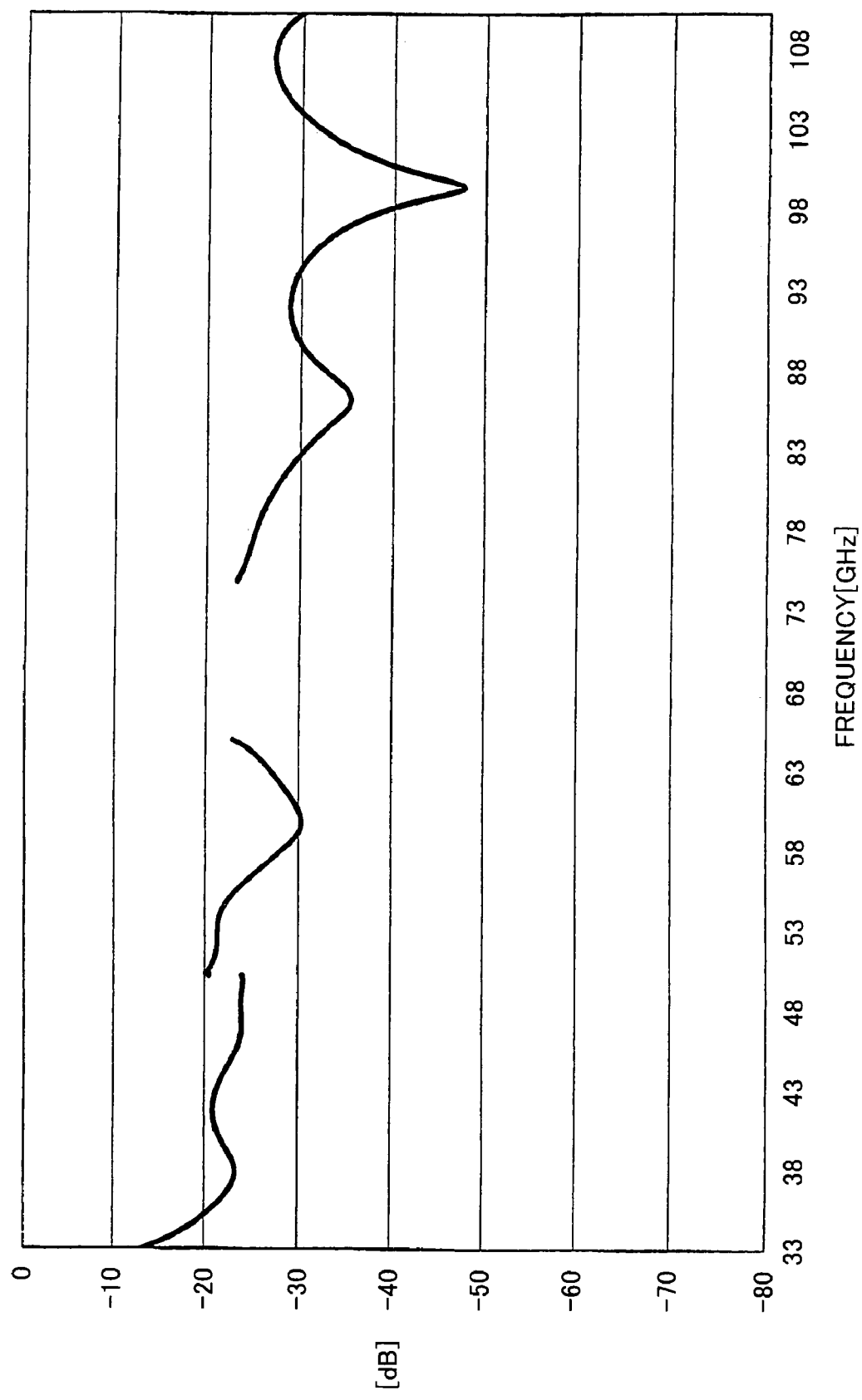
FIG. 22 is a chart showing electromagnetic wave absorbing performance of a composite body for absorbing an electromagnetic wave having the shape shown in FIG. 16.

As shown in FIGS. 20-22, it is recognized that it is possible to much further improve the electromagnetic wave absorbing performance by forming concave and convex portions at the top face of wall portion 4, rather than by providing inclined planes 11 at the top face of wall portion 4 to allow the top face of wall portion 4 to have a mountain-like shape.

As described above, the embodiments and examples of the present invention have been described. From the beginning, it has also been intended to conveniently combine the components of each of the embodiments and examples. All the embodiments and examples disclosed here are intended to be illustrative in all aspects rather than restrictive. The scope of the present invention should be defined by the claims, and all changes made in the scope of the present invention and equivalents thereof should be construed as falling within the scope of the present invention.

INDUSTRIAL APPLICABILITY

The present invention can effectively be applied to a composite body for absorbing an electromagnetic wave, which absorbs a radio noise coming externally, and a method of manufacturing the same.

The invention claimed is:

1. A composite body for absorbing an electromagnetic wave including a thermoplastic resin consisting of at least one of polypropylene and methylpentene polymer blended with 30-58% by volume of soft magnetic material powder having a scale-like shape and an aspect ratio of 3-20 and a mean particle diameter converted to spherical diameter of 5-50 µm, comprising a unit cell having a bore extending from a top face to a bottom face, wherein
   a portion of said bore located on a side of said bottom face has a smaller cross-sectional area than that of said bore at said top face, and
   a height of said unit cell from the bottom face to said top face is at least 1.2 times and at most 10 times as large as the maximum width of said bore at the top face of said unit cell.

2. The composite body for absorbing an electromagnetic wave according to claim 1, wherein a concave portion is provided around said bore to extend from the bottom face of said unit cell to the top face of said unit cell.

3. The composite body for absorbing an electromagnetic wave according to claim 2, wherein
   said concave portion surrounds said bore, and forms a cylindrical portion surrounding said bore on a side of the bottom face of said unit cell.

4. The composite body for absorbing an electromagnetic wave according to claim 3, comprising a rib connecting said cylindrical portions.

5. A composite body for absorbing an electromagnetic wave comprising a thermoplastic resin blended with 20-60% by volume of soft magnetic material powder, having a bore) extending from a top face to a bottom face, and wall portions surrounding said bore, wherein
   a portion of said bore located on a side of said bottom face has a smaller cross-sectional area than that of said bore at said top face,
   convex portions are provided at top faces of intersections of said wall portions, and
   concave portions are provided at top faces of said wall portions located between said intersections.

6. A method of manufacturing a composite body for absorbing an electromagnetic wave, comprising the steps of:
   kneading a thermoplastic resin consisting of at least one of polypropylene and methylpentene polymer blended with 30-58% by volume of soft magnetic material powder having a scale-like shape and an aspect ratio of 3-20 and a mean particle diameter converted to spherical diameter of 5-50 µm and with 1-9% by volume of a molding assistant and a kneading assistant to provide a kneaded material;
   injection-molding said kneaded material to provide a compact; and
   cooling said injection-molded compact for solidification without performing steps of degreasing and sintering between the step of injection molding and the step of cooling the injection-molded compact.

* * * * *